(12) United States Patent  
Clark et al.

(10) Patent No.: US 8,907,734 B2  
(45) Date of Patent: Dec. 9, 2014

(54) PASSIVE AND ACTIVE SUPPRESSION OF VIBRATION INDUCED PHASE NOISE IN OSCILLATORS

(71) Applicants: Roger L. Clark, Windham, NH (US); Ernest P. Caramanis, Salem, NH (US)

(72) Inventors: Roger L. Clark, Windham, NH (US); Ernest P. Caramanis, Salem, NH (US)

(73) Assignee: Raytheon Company, Waltham, MA (US)

( * ) Notice: Subject to any disclaimer, the term of this patent is extended or adjusted under 35 U.S.C. 154(b) by 62 days.

(21) Appl. No.: 13/650,414

(22) Filed: Oct. 12, 2012

(65) Prior Publication Data

US 2014/0104006 A1     Apr. 17, 2014

(51) Int. Cl.  
*H03B 5/32* (2006.01)  
*H03B 5/36* (2006.01)

(52) U.S. Cl.  
CPC . *H03B 5/36* (2013.01); *H03B 5/326* (2013.01)  
USPC .. 331/158; 331/154; 331/116 R; 331/116 FE; 331/107 A; 331/116 M; 331/65

(58) Field of Classification Search  
USPC ............ 331/158, 116 R, 116 FE, 107 A, 154, 331/116 M, 2  
See application file for complete search history.

(56) References Cited

U.S. PATENT DOCUMENTS

| | | | |
|---|---|---|---|
| 4,453,141 A | 6/1984 | Rosati | |
| 4,575,690 A | 3/1986 | Walls et al. | |
| 4,891,611 A * | 1/1990 | Frerking | 331/158 |
| 5,250,871 A | 10/1993 | Driscoll et al. | |
| 7,106,143 B2 | 9/2006 | Bloch et al. | |
| 8,188,800 B2 | 5/2012 | Fry | |
| 2012/0105175 A1 | 5/2012 | Clark et al. | |

OTHER PUBLICATIONS

A. Hati, C.W. Nelson, D.A.Howe, Phase-Lock Loops in Vibration Environments, 41$^{st}$ Annual Precise Time and Time Interval (PTTI) Meeting, pp. 303-312.  
Northrop Gruman, Vibration-Induced Phase Noise in Signal Generation Hardware, EFTF-IFCS 2009 Joint-Conference, Besancon, France, Apr. 20, 2009, pp. 1-62.  
SAW Oscillators for Phase Locked Applications, Joseph, T. R., Proceedings of 31st Annual Symposium on Frequency Control, 1977).

* cited by examiner

*Primary Examiner* — Arnold Kinkead  
(74) *Attorney, Agent, or Firm* — Daly, Crowley, Mofford & Durkee, LLP

(57) ABSTRACT

An oscillator system having: an UHF oscillator, such as a SAW oscillator, for producing a signal having a controllable frequency; a passive vibration, suppressor mechanically coupled to the UHF oscillator for suppressing vibrations above a predetermined bandwidth BW1 on the UHF oscillator; and an active vibration suppressor. The active vibration suppressor includes an accelerometer for sensing vibrations within a predetermined bandwidth BW2 on the UHF oscillator; and an HF or VHF oscillator, such as a crystal oscillator, producing a signal having a frequency controlled by the accelerometer. A control loop having a bandwidth changeable with sensed vibration level is fed the oscillator and the UHF oscillator for controlling the frequency of the signal produced by the SAW oscillator in accordance with a difference between the signal produced the HF or VHF oscillator and the signal produced by the UHF oscillator, the control loop having a bandwidth BW3; where BW1<BW3<BW2.

11 Claims, 2 Drawing Sheets

PASSIVE AND ACTIVE SUPPRESSION OF VIBRATION INDUCED PHASE NOISE IN OSCILLATORS

TECHNICAL FIELD

This disclosure relates generally to oscillators and more particularly to suppression of vibration induced phase noise in oscillators.

BACKGROUND

As is known in the art, mechanical acceleration influences the frequency produced by oscillators. More particularly, mechanical vibration induces modulation of the RF frequency with associated unwanted phase noise. This is a well-known effect and long standing issue with RF oscillators. Various methods have been tried to reduce the acceleration sensitivity and/or reduce the vibration levels that are applied to the oscillator.

As is also known in the art, crystal oscillators operate at high frequencies (HF) through very high frequencies (VHF), while surface acoustic wave (SAW) oscillators operate at ultra high frequencies (UHF) and low microwave frequencies.

As is also known, radio frequency (RF) systems often require a UHF or microwave local oscillator (LO) signal, as derived from a SAW oscillator. Passive vibration isolators (e.g., mechanical vibration absorbers) are commonly used to reduce the effect of applied vibration on the SAW device. While these are effective at vibration frequencies well above the mechanical resonant frequency of the SAW oscillator, the vibration is amplified at the mechanical resonant frequency of the SAW device; these passive vibration isolators do not suppress vibration at frequencies below the mechanical resonant frequency of the SAW device. In addition, lowering the mechanical resonant frequency requires large sway space for the device.

Another technique used to reduce the effect of vibration on an oscillator is active vibration compensation. With crystal oscillators, accelerometers are used to sense vibration and in response to the sensed vibration modulate the oscillator frequency to reduce the effective oscillator acceleration sensitivity in the crystal oscillators. Active compensation is however only effective at low vibration frequencies due to bandwidths of the accelerometers, phase shifts in the compensation electronics, and mechanical cross-axis coupling. Furthermore, if a single crystal oscillator is passively isolated, interactions between phase shifts in the active compensation and the passive isolation may increase the levels of phase noise at certain vibration frequencies. U.S. Pat. No. 4,453,141 and later similar patents including U.S. Pat. No. 7,106,143, Bloch et al, issued Sep. 12, 2002, U.S. Pat. No. 5,250,871 inventors Driscoll et al. and U.S. Pat. No. 8,188,800 have described a method using two crystals which are physically oriented so that acceleration induced frequency shifts are opposing. lithe shifts are equal in magnitude and opposite in phase, they will cancel. Crystal acceleration sensitivity is not predictable, so this method requires screening large numbers of crystals. In addition, a mechanical gimbal is required. The mechanics introduce other problems including large size and/or degraded temperature stability. U.S. Pat. No. 4,575,690 describes a proposed improvement, but this method is also difficult to implement.

As is also known, UHF SAW oscillators are commonly locked to VHF or HF crystal oscillators to improve the frequency accuracy of the signal from the SAW oscillator. Crystal oscillators have superior frequency accuracy and stability as compared to SAW oscillators, (see "SAW Oscillators for Phase Locked Applications", Joseph, T. R., Proceedings of $31^{st}$ Annual Symposium on Frequency Control, 1977) while SAW oscillators have superior phase noise at higher offset frequencies than a multiplied crystal oscillator.

SUMMARY

In accordance with the present disclosure, an oscillator system is provided having: a surface acoustic wave (SAW) oscillator for producing a signal having a controllable frequency; a passive vibration suppressor mechanically coupled to the SAW oscillator for suppressing vibrations on the SAW oscillator; and an active vibration suppressor, The active vibration suppressor comprises: a crystal oscillator; an accelerometer for sensing vibrations on the crystal oscillator. The crystal oscillator produces a signal having a frequency controlled by the accelerometer. A control loop is fed the crystal oscillator and the SAW oscillator for controlling the frequency of the signal produced by the SAW oscillator in accordance with a difference between the signal produced the crystal oscillator and the signal produced by the SAW oscillator, In one embodiment, the passive vibration suppressor suppresses vibrations above a predetermined bandwidth BW1 on the SAW oscillator; an active vibration suppressor senses vibrations within a predetermined bandwidth BW2 of the crystal oscillator and thus the active vibration suppressor has a bandwidth BW2; and the control loop has a bandwidth BW3 and wherein BW1<BW3<BW2.

In one embodiment, the control loop has a bandwidth changeable with sensed vibration level.

In one embodiment, the bandwidth is controlled dynamically (adaptively) in response to vibration levels. At very low levels of vibration (i.e., at a sensed vibration level below a predetermined vibration level), the control loop bandwidth is reduced from a first bandwidth to a second lower bandwidth achieve the lowest phase noise from the SAW oscillator output. At higher levels of vibration (i.e., vibration levels above the predetermined vibration level), the control loop bandwidth is increased to the first bandwidth to suppress vibration induced phase noise, In one embodiment, the control loop is a phased locked loop (PLL).

With such an arrangement, the PLL bandwidth is selected to be greater than the mechanical resonant frequency of the vibration isolators, but below the bandwidth of the active compensation system (i.e., the active vibration suppressor). In essence, the active compensation (i.e., the active vibration suppressor) suppresses phase noise at low frequencies, including static acceleration forces, Passive vibration isolation suppresses phase noise at higher frequencies. By selecting the PLL bandwidth and the degree of electronic compensation, vibration induced phase noise can be suppressed over the entire spectrum of applied vibration frequencies. Additional reductions in phase noise can be obtained by incorporating a symmetrical SAW resonator into the system as described in U.S. Patent Application No. 2012/0105175, entitled "SURFACE ACOUSTIC WAVE RESONATOR MOUNTING WITH LOW ACCELERATION SENSITIVITY", published May 3, 2012, inventors Clark; Roger L.; et al., and assigned to the same assignee as the present patent application The oscillator system suppresses vibration induced phase noise in the RF signal from the SAW oscillator across the entire spectrum of vibration frequencies, beginning at zero Hz (i.e. "tipover").

Thus, with the disclosed oscillator system, a composite signal generation system comprised of a vibration isolated UHF SAW oscillator which is phase locked at a specified bandwidth to an HP to VHF crystal oscillator having very low levels of acceleration sensitivity. This arrangement transfers the acceleration sensitivity of the crystal oscillator to the UHF output for vibration frequencies well inside the PLL bandwidth. The PLL bandwidth is much wider than the critical frequency of the vibration isolation system for the UHF SAW oscillator. This suppresses the vibration induced phase noise of the UHF SAW oscillator output at frequencies approaching and beyond the PLL bandwidth. The PLL bandwidth is controlled dynamically (adaptively) in response to vibration levels. At very low levels of vibration (i.e., at a sensed vibration level below a predetermined vibration level), the control loop bandwidth is reduced from a first bandwidth to a second lower bandwidth achieve the lowest phase noise from the SAW oscillator output. At higher levels of vibration (i.e., vibration levels above the predetermined vibration level), the control loop bandwidth is increased to the first bandwidth to suppress vibration induced phase noise. The PLL bandwidth can be adaptively modified using well-known digital filtering techniques.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
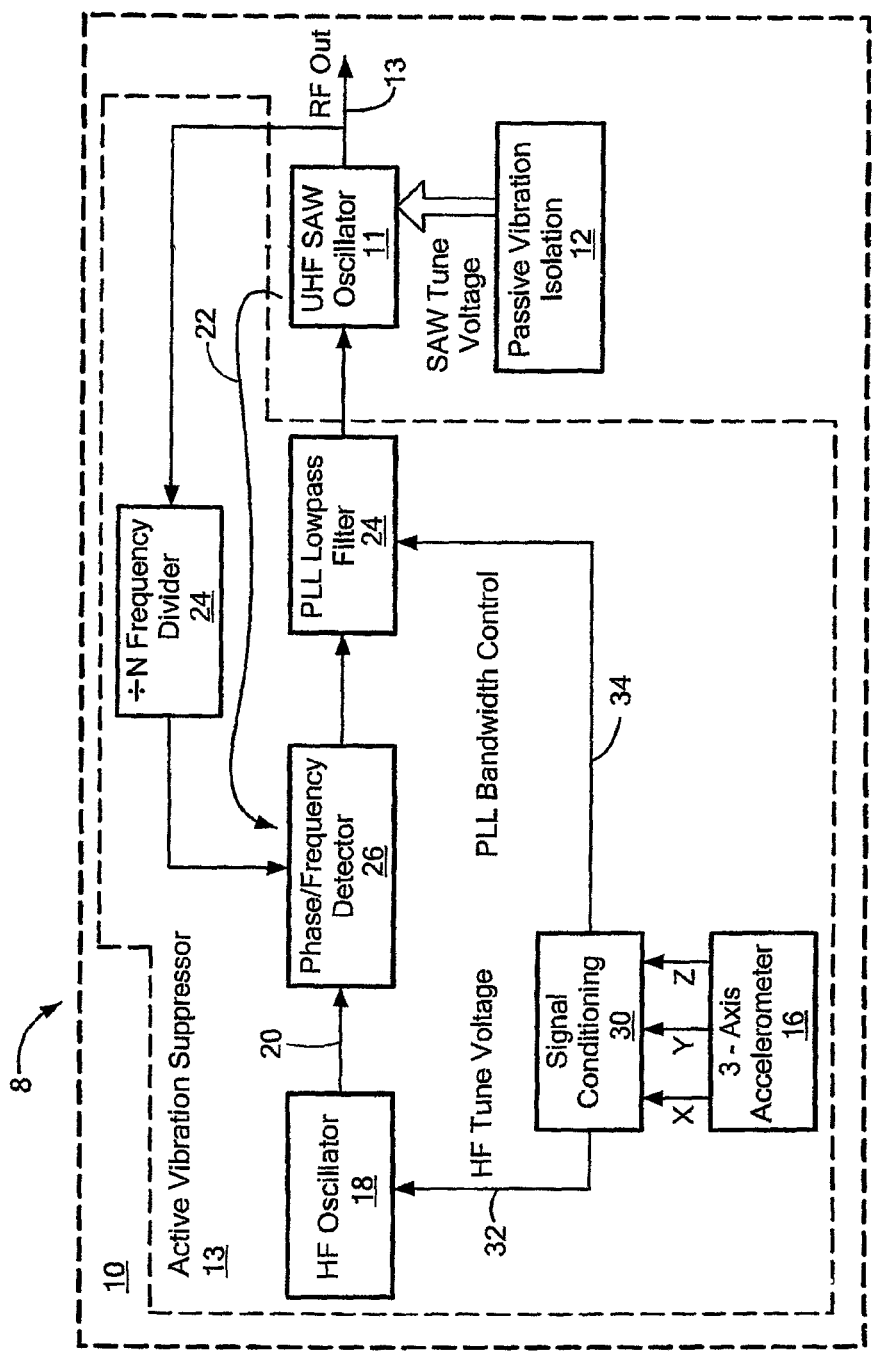
FIG. 1 is a block diagram of an oscillator system according to the disclosure and FIG. 2 is a block diagram of a signal conditioning circuit used in the oscillator system of FIG. 1.
Figure 2:
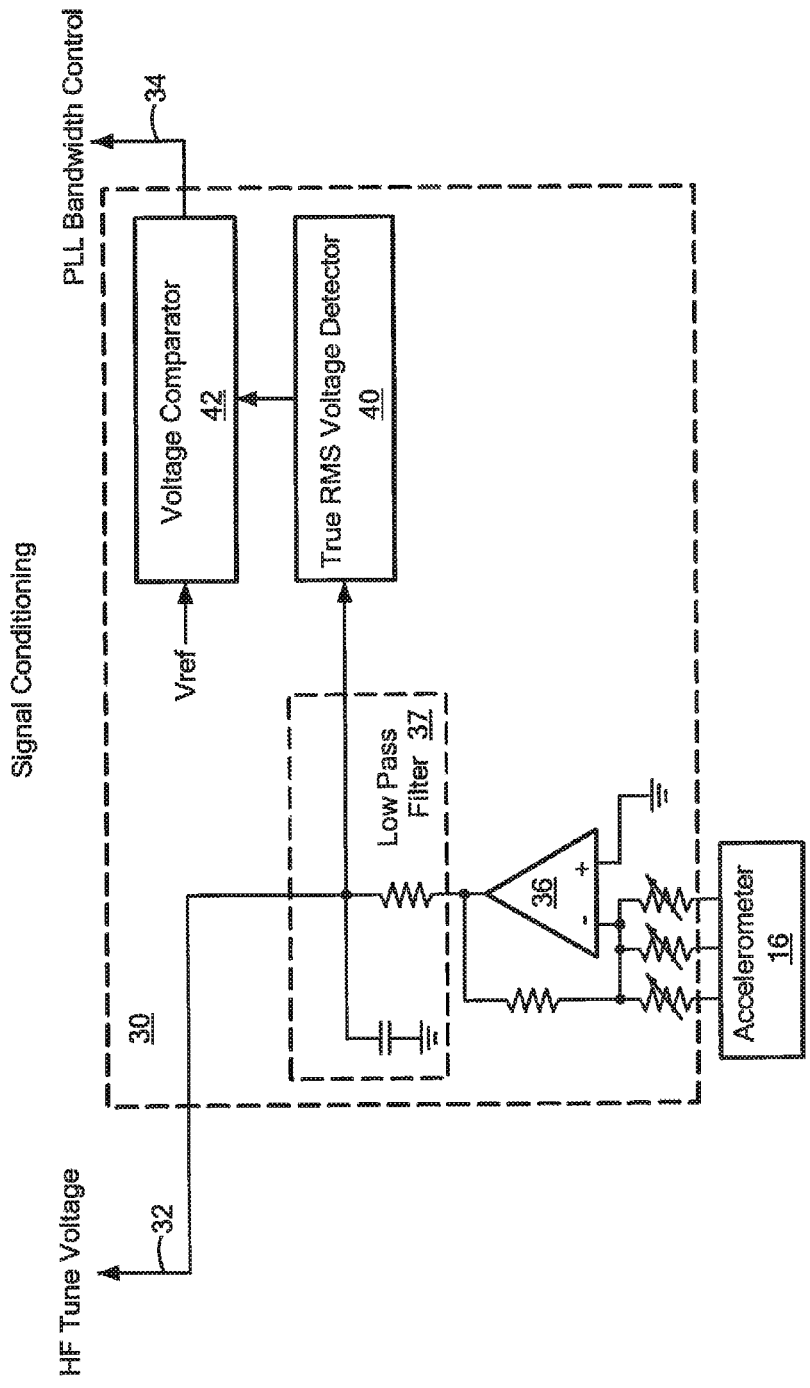

Referring now to FIG. 1, an oscillator system 8 is shown mounted on a platform 10. The oscillator system 8 includes: an. UHF SAW oscillator 11, for producing an RF signal on line 13 having a controllable frequency; a passive vibration suppressor 12 physically disposed between the UHF SAW oscillator 11 and the platform 10, and thus mechanically coupled to the SAW oscillator 11, for mechanically suppressing vibrations on the SAW oscillator 11; and an active vibration suppressor 13 having: a crystal oscillator 18; a control loop 22, here a phase locked loop (PLL), having: a divide by N detector 24 coupled to the output of the SAW oscillator 11; a phase/frequency detector 26 fed by both the crystal oscillator 18 and the output of the divide by N detector 24; a PLL low pass filter 24 having a voltage controllable bandwidth, the output being used to control the frequency of the signal produced by the SAW oscillator 11; a three axis accelerometer 16 for sensing vibrations on the crystal oscillator 11 in three orthogonal axis, X, Y and Y of a Cartesian co-ordinate system; and signal conditioning circuitry 30 to be described in more detail in FIG. 2 for producing control signals for controlling the frequency of the signal produced by the crystal oscillator 18 and for controlling the bandwidth of the voltage controllable low pass filter 24.

More particularly, the crystal oscillator 18 produces a signal on line 20 having a frequency controlled by the accelerometer 16. The control loop 22 is, as noted above, fed the crystal oscillator 18 and the SAW oscillator 11 for controlling the frequency of the signal on line 13 produced by the SAW oscillator 11 in accordance with a difference in phase between the signal produced the HF or VHF crystal oscillator 18 and the signal produced by the SAW oscillator 11. The PLL 22 receives as a reference frequency signal the signal on line 20 produced by the crystal oscillator 18. The RF signal on line 13 produced by the UHF SAW oscillator is fed to the divide by N frequency divider 24, where N is an integer, for example, with the SAW oscillator 13 producing a desired RF signal 320 MHz and the crystal oscillator 18 producing a signal having a frequency of 10 MHz, N would be 32. The output of the divide by N frequency divider 24 is fed to the phase/frequency detector 26 along with the reference frequency signal the signal on line 20 produced by the crystal oscillator 18. Any difference in the phase between the signal at the output of the divide by N frequency divider 24 and the reference frequency signal the signal on line 20 produced by the oscillator 18 is fed to the voltage controllable PLL low pass filter 24. The output of the PLL low pass filter 24 then produces a control signal for the UHF SAW oscillator 11. The PPL 20 thus drives and maintains the frequency of the RF signal on line 13 at the frequency of the signal on line 20 at the output of the crystal oscillator 18.

The frequency of the signal on line 20 is adjusted for vibration on the platform 10 by vibrations on the platform 10 sensed by the accelerometer 16. The signals produced by vibrations sensed on each of the three axis of the accelerometer 16 are fed to a signal conditioning circuit 30, shown in more detail in FIG. 2. The signal condition circuit 30 includes a summing amplifier 36 for summing the signals sensed on the three axis of the accelerometer 30 and the output of amplifier 36 is fed to a low pass filter 37 which produces an output voltage signal on line 32. The signal on line 32 is fed to: (A) the crystal oscillator 18 to provide a tuning signal to the SAW oscillator 11; and (B) a true ROOT MEAN SQUARE (RMS) voltage detector 40. The RMS value of the signal on line 32 is produced by the true RMS voltage detector 40 is fed to a voltage comparator 42. The voltage comparator 42 is also fed by a reference voltage VREF. The reference voltage VREF establishes a predetermined threshold voltage level so that if the vibration sensed by the accelerometer 16 exceeds a predetermined level VREF corresponding to this threshold acceleration level, the BW3 of the PLL 22 is increased to provide increased active suppression of phase noise. On the other hand, if the vibration is below the threshold, as set by VREF, then BW3 is reduced. The change in BW3 is, for example, 10:1 for example 200 Hz to 20 Hz. Thus, in a low vibration environment or in the absence vibration the phase noise at low offset frequencies of the oscillator system 10 in a low vibration environment is optimized due to the better phase noise of the SAW oscillator 11. In a high vibration environment, the phase noise at low offset frequencies is also optimized due to the active compensation of the crystal oscillator 18 provided by the signal on line 32. The difference between the voltage VREF and the voltage produced by the true RMS voltage detector 40 is converted by the voltage comparator 42 into a control signal on line 42 for controlling the bandwidth of the PLL low pass filter 24.

More particularly, in the absence of vibration on the platform 10, the voltage at the output of the summing amplifier 36 is zero and hence the voltage on line 32 is zero resulting in the HF oscillator 48 producing a signal on line 20 having a frequency N times the desired RF frequency of the signal produced by the UHF SAW 11 on line 13. Also, the voltage at the output of the true RMS value detector 40 is zero. The reference voltage VREF is selected such that in the absence of vibration on the platform 10, the voltage produced by the voltage comparator 42 on line 34 results in the low pass filer producing a signal for the SAW 11 such that the signal on line 32 is zero volts for example, the SAW oscillator 11 produces the desired RF frequency of the signal produced by the SAW 11 on line 13.

In response to a vibration on the platform 10, the summing amplifier 6 produces a voltage on line 32 that results in a corresponding change in the frequency of the signal on produced line 20 by HF oscillator 12 and a corresponding change in the output of the voltage comparator 24 (thereby resulting in a change in the cut off frequency of the low pass filter 24) with the result that the desired RF frequency of the signal produced by the UHF SAW 11 is maintained and not effected by vibrations on the platform, 10.

It is noted that the passive vibration suppressor 12 suppresses vibrations above a predetermined bandwidth BW1 on the SAW oscillator 11; the active vibration suppressor 13 senses vibrations on the oscillator 11 within a predetermined bandwidth BW2 and thus has a bandwidth BW2; and the control loop 22 has a bandwidth BW3 and wherein BW1<BW3<BW2. Here, for example, BW1~40 Hz; BW3 is ~250 Hz and BW2~1 kHz. It is noted that a typical vibration bandwidth is 10 Hz to 2 kHz.

A number of embodiments of the disclosure have been described. Nevertheless, it will be understood that various modifications may be made without departing from the spirit and scope of the disclosure.

What is claimed is:

1. An oscillator system, comprising:
   a surface acoustic wave (SAW) oscillator for producing a signal having a controllable frequency;
   a passive vibration suppressor mechanically coupled to the SAW oscillator for suppressing vibrations on the SAW oscillator;
   an active vibration suppressor comprising:
      a crystal oscillator;
      an accelerometer for sensing vibrations on the crystal oscillator; and
      wherein the crystal oscillator produces a signal having a frequency controlled by the accelerometer;
      a control loop fed by the crystal oscillator and the SAW oscillator for controlling the frequency of the signal produced by the SAW oscillator in accordance with a difference between the signal produced the crystal oscillator and the signal produced by the SAW oscillator; and
   wherein: the passive vibration suppressor suppresses vibrations above a predetermined bandwidth BW1 on the SAW oscillator; the active vibration suppressor has a predetermined bandwidth BW2; and the control loop having a bandwidth BW3 and wherein BW1<BW3<BW2.

2. The oscillator system recited in claim 1 wherein the control loop is a phased locked loop.

3. The oscillator system recited in claim 1 wherein the SAW oscillator is a UHF oscillator and the crystal oscillator is an HF or VHF oscillator.

4. The oscillator system recited in claim 3 wherein the control loop is a phased locked loop.

5. An oscillator system, comprising:
   a surface acoustic wave (SAW) oscillator for producing a signal having a controllable frequency;
   a passive vibration suppressor mechanically coupled to the SAW oscillator for suppressing vibrations on the SAW oscillator;
   an active vibration suppressor comprising:
      an active vibration suppressor oscillator;
      an accelerometer for sensing vibrations on the active vibration suppressor oscillator; and
      wherein the active vibration suppressor oscillator produces a signal having a frequency controlled by the accelerometer;
      a control loop fed by the active vibration suppressor oscillator and the SAW oscillator for controlling the frequency of the signal produced by the SAW oscillator in accordance with a difference between the signal produced the active vibration suppressor oscillator and the signal produced by the SAW oscillator; and
   wherein: the passive vibration suppressor suppresses vibrations above a predetermined bandwidth BW1 on the SAW oscillator; the active vibration suppressor has a bandwidth BW2; and the control loop having a bandwidth BW3 and wherein BW1<BW3<BW2.

6. The oscillator system recited in claim 5 wherein BW1~40 Hz; BW3 is ~250 Hz and BW2~1 kHz.

7. An oscillator system, comprising:
   an UHF oscillator for producing a signal having a controllable frequency;
   a passive vibration suppressor mechanically coupled to the SAW oscillator for suppressing vibrations on the SAW oscillator;
   an active vibration suppressor comprising:
      an HF or VHF oscillator;
      an accelerometer for sensing vibrations on the HF or VHF oscillator; and
      wherein the HF or VHF oscillator produces a signal having a frequency controlled by the accelerometer;
      a control loop fed by the oscillator and the UHF oscillator for controlling the frequency of the signal produced by the UHF oscillator in accordance with a difference between the signal produced the HF or VHF oscillator and the signal produced by the UHF oscillator;
   wherein: the passive vibration suppressor suppresses vibrations above a predetermined bandwidth BW1 on the SAW oscillator; the active vibration suppressor has a predetermined bandwidth BW2; and the control loop having a bandwidth BW3 and wherein BW1<BW3<BW2.

8. The oscillator system recited in claim 7 wherein: BW1~40 Hz; BW3 is ~250 Hz and BW2~1 kHz.

9. An oscillator system, comprising:
   a surface acoustic wave (SAW) oscillator for producing a signal having a controllable frequency;
   an active vibration suppressor comprising:
      an crystal oscillator;
      an accelerometer for sensing vibrations on the crystal oscillator; and
      wherein the crystal oscillator produces a signal having a frequency controlled by the accelerometer;
      a control loop fed by the oscillator and the SAW oscillator for controlling the frequency of the signal produced by the SAW oscillator in accordance with a difference between the signal produced the crystal oscillator and the signal produced by the SAW oscillator, the control loop has a bandwidth changeable with sensed vibration level:
   wherein at sensed vibration level below a predetermined vibration level, the control loop bandwidth is reduced from a first bandwidth to a second higher bandwidth and at sensed vibration levels above the predetermined vibration level, the control loop bandwidth is increased to the first bandwidth.

10. The oscillator system recited in claim 5 wherein the active vibration suppressor oscillator is a crystal oscillator.

11. The oscillator system recited in claim 5 wherein the SAW oscillator is a UHF oscillator and the active vibration suppressor oscillator is an HF or VHF oscillator.

\* \* \* \* \*